US008078997B2

(12) United States Patent
Lapanik

(10) Patent No.: US 8,078,997 B2
(45) Date of Patent: Dec. 13, 2011

(54) METHOD, SYSTEM, AND COMPUTER PROGRAM PRODUCT FOR IMPLEMENTING A DIRECT MEASUREMENT MODEL FOR AN ELECTRONIC CIRCUIT DESIGN

(75) Inventor: Dmitri Lapanik, Kanagawa (JP)

(73) Assignee: Cadence Design Systems, Inc., San Jose, CA (US)

( * ) Notice: Subject to any disclaimer, the term of this patent is extended or adjusted under 35 U.S.C. 154(b) by 517 days.

(21) Appl. No.: 11/966,979

(22) Filed: Dec. 28, 2007

(65) Prior Publication Data

US 2009/0172616 A1 Jul. 2, 2009

(51) Int. Cl.
*G06F 17/50* (2006.01)
(52) U.S. Cl. .......................................... 716/54
(58) Field of Classification Search ................. 716/5, 54
See application file for complete search history.

(56) References Cited

U.S. PATENT DOCUMENTS

| | | | |
|---|---|---|---|
| 6,573,497 B1 | 6/2003 | Rangarajan et al. | |
| 6,573,993 B2 | 6/2003 | Little | |
| 7,673,278 B2 * | 3/2010 | Rathsack et al. | 716/56 |
| 2005/0132306 A1 * | 6/2005 | Smith et al. | 716/1 |
| 2005/0184252 A1 * | 8/2005 | Ogawa et al. | 250/492.3 |
| 2006/0266243 A1 * | 11/2006 | Percin et al. | 101/484 |
| 2007/0276634 A1 * | 11/2007 | Smith et al. | 703/1 |

OTHER PUBLICATIONS

Johnson, E. W., et al., Measurement and Analysis of Sequential Design Processes, ACM Transactions on Design Automation of Electronic Systems, Jan. 1998, vol. 3, Issue 1, pp. 1-20.
Frerichs, M. R., Precise Extraction of Ultra Deep Submicron Interconnect Parasitics with Parameterized 3D-Modeling, Proceedings of the ASP-DAC 2001. Asia and South Pacific Design Automation Conference, 2001, pp. 50-55.
Yang, J., An Upstream Design Autofix Flow for Manufacturability Enhancement, 43rd ACM/IEEE Design Automation Conference, 2006, pp. 73-76.
Duncan, C. A., et al., Efficient Approximation and Optimization Algorithms for Computational Metrology, Proceeding SODA '97 Proceedings of the eighth annual ACM-SIAM symposium on Discrete algorithms, 1997, pp. 121-130.
Yang, J., et al., Advanced Timing Analysis Based on PostOPC Extraction of Critical Dimensions, Proceeding DAC '05 Proceedings of the 42nd annual Design Automation Conference, 2005, pp. 359-364.
Yu, P., et al., Process Variation Aware OPC with Variational Lithography Modeling, 43rd ACM/IEEE Design Automation Conference, 2006, pp. 785-790.

* cited by examiner

*Primary Examiner* — Jack Chiang
*Assistant Examiner* — Brandon Bowers
(74) *Attorney, Agent, or Firm* — Vista IP Law Group, LLP

(57) ABSTRACT

Various embodiments of the present invention are generally directed to a method, system, and computer program product for implementing direct measurement model with simulation and calibration of manufacturing process model in the manufacturing of precision devices such as electronic integrated circuits. The method and the system determine the measured measurement result and the direct measurement information and compare the direct measurement information against the other to determine whether to adjust the process models and the empirical parameters thereof.

33 Claims, 9 Drawing Sheets

METHOD, SYSTEM, AND COMPUTER PROGRAM PRODUCT FOR IMPLEMENTING A DIRECT MEASUREMENT MODEL FOR AN ELECTRONIC CIRCUIT DESIGN

BACKGROUND

Simulation of the process of manufacturing of an integrated circuit has been proven to be invaluable for circuit designers and other alike as it helps to decrease very high costs of manufacturing and shortens the time to market dramatically. However, correct simulation of the process of manufacturing a physical design of an integrated circuit requires correct building of the manufacturing models. Nonetheless, accurate semiconductor manufacturing models usually involve enormous number of characteristics interacting with each other often in some non-linear manner. Therefore, correct semiconductor manufacturing modeling not only requires extremely high computing resources and oftentimes takes a long time to reach accurate results. As such, the construction of an accurate manufacturing model is usually very difficult. This problem is further aggravated by the fact that a modern integrated circuit often comprises many manufacturing process steps, and this increasingly complicated manufacturing process makes precise simulation of the results on wafers even more challenging.

Moreover, as the feature sizes in the modern IC layouts continue to shrink down to 65 nm or below, manufacturing process effects become harder to predict and control. A modern manufacturing process is extremely difficult to be modeled by a set of empirical rules and often requires computations based upon modeling the physical processes during the IC manufacturing. A modern manufacturing process includes many stages and many physical, chemical, mechanical, and electromagnetic effects to model. Modeling such a process requires very intensive numerical calculations.

As a result, a more practical and economical approach is to use empirical manufacturing process models containing various numbers of empirical manufacturing process parameters to simulate the manufacturing processes. These empirical manufacturing models require much less computing resources but are typically calibrated against experimental data so as to give reasonably close approximations of the manufacturing processes. Such empirical approximations contain parameters that may at best be roughly rather than accurately estimated and therefore must be calibrated to a specific process to achieve good modeling accuracy. Such a process of calibrating these empirical coefficients is called model calibration. The model calibration is now an inevitable and extremely important part of the modern manufacturing process simulation flow. Once the manufacturing process is fixed, a test layout comprising one or more geometrical patterns is designed and manufactured on a test wafer using this particular set of manufacturing processes. The resultant geometries on the wafer corresponding to the test patterns are then measured by using equipment such as a scanning electron microscope (SEM) with sufficient resolution. Thereafter, an empirical model of this particular process is prepared, and the parameters of the empirical model are adjusted so that the predictions by the empirical model best fit the experimental data collected from the experiment. Note that the adjustment of empirical model parameters may be performed manually, automatically by using special software applications, or semi-automatically.

Nanometrology is the science and practice of measurement that mostly concerns with dimensional parameters on components with at least one critical dimension which is smaller than 100 nm. Although still called microelectronics, the production of semiconductor devices with smallest feature widths well below 100 nm is the economically most important part of nanotechnology nowadays and presumably in the near future. In parallel with the shrinking dimensions of the components and structures produced in the semiconductor industry, the required measurement uncertainties for dimensional metrology in this important technology field are decreasing too. This contribution will provide an overview on developments in the field of nanometrology with a special focus on the demands from the semiconductor industry from the point of view of a metrology institute.

In many cases in nanometrology, the values of certain quantities such as geometrical dimensions of the sample's features cannot be measured directly, but must be extracted from a set of values obtained from direct measurement of other related quantities. For example, a measurement of the critical dimensions of an integrated circuit's feature consists of measuring the scattered electron beam intensity profile several times along a small section of the sample and numerical processing of the measured intensity profile to obtain the critical dimension value. Therefore, even using the same sample and same measurement device, different methods of numerical processing would lead to different values of the quantity. Also, the numerical processing algorithms involved into the extraction of the quantities of interest are very sensitive to the input data noise. Slight changes in feature wall angle, edge and surface roughness, or material properties can dramatically affect the precision and accuracy offset of the quantity being determined. Moreover, imaging characteristics for most types of precise measuring devices such as electron microscopes are not constant, which makes it even more difficult to perform accurate measurement.

Typically the process engineer will use in-house or "golden standards" to track the repeatability of a measurements. Unfortunately, variations in the features to be measured can cause the accuracy offset to change in ways that are unknown to the engineer. Furthermore, the offsets of multiple tools in a set, as well as differences in the numerical processing algorithms will not only change with respect to the reference but also relatively to each other. If these different measurement sets are used as an input for a process model calibration, the resulting calibrated models can easily be very much different, although related to the same reference sample.

Due to the increasingly complex manufacturing processes, the manufacturing models are usually calibrated against some experimental (or measured) data from a wafer with either some test patterns or other device patterns. Unless otherwise noted, the terms "experimental" and "measured" are used interchangeably throughout the entire Application to indicate or represent the information or data obtained from some test patterns or device patterns on a wafer. Once a manufacturing process is determined, a test layout or a test pattern is designed and reproduced on a wafer using the designated manufacturing process. The reproduced results on the wafer are then measured by using, for example, a scanning electron microscope (SEM) due to its high resolution to discern micro- or even nano-scale features on the wafer.

An empirical process model with one or more empirical process parameters may also be determined once the manufacturing process is determined. Note that the empirical process parameters may be adjusted such that the numerical predictions of the empirical process model better fit the data measured from the processed test patterns on a wafer.

Nonetheless, since the conventional modern manufacturing process modeling operates with the notion of a critical dimension of a layout feature, or the notion of a contour of a layout feature, it assumes that the printed layout features can be accurately approximated by step functions or near step functions, for the notions of the critical dimension or the notion of the contour to be accurately applicable. That is, modern manufacturing process modeling assumes that the sidewalls of the geometrical features on the wafer are vertical or almost vertical with clearly defined edges. For example, one-dimensional scan data have been used for the critical dimension (CD) extraction, while two-dimensional images are used for the feature contour extraction. This assumption has been proven, however, to be not the case for the modern low-contrast manufacturing processes at 65 nm and beyond, especially at the locations where the features become essentially two-dimensional, such as rounded line ends. With such low contrast manufacturing processes, the feature edges are no longer clearly defined but often appear to be "smeared" over some range defined by the specific feature topography.

FIGS. 1A-1C illustrate the impact of low-contrast images produced by a manufacturing process on the determination of locations of edges or contours of a feature of an integrated circuit. For example, as shown in FIGS. 1A-1C. The critical dimension or contour extraction becomes more problematic and less accurate as the edges become less clearly defined. FIG. 1A shows a feature with relatively clearly defined side walls. In this case, the width of the feature may be better determined by even the conventional edge or contour extraction algorithms.

FIG. 1B shows a feature with slant side walls. In this case, it is more difficult to determine the location of the "edges" of the feature, and as a result, the width of the feature depends heavily upon a predetermined threshold for the edge or contour extraction algorithm and thus may not be accurately determined. This problem is exacerbated as the semiconductor device geometries continue to shrink as it may be seen from FIG. 1C which illustrates a feature on a wafer with similar slant side walls but for a larger feature. In FIG. 1C, although the locations of the side walls are still more difficult to determine and may still heavily depend upon the predetermined threshold for the extraction algorithm, the impact of this imprecise determination of the contours of this particular feature in FIG. 1C is lessened as a result of the larger size of the feature.

Theoretically, a typical edge detection algorithm using a SEM analyzes the data collected from the SEM to determine the location of an edge. Where a test pattern is scanned by a SEM, the electron beam hitting a point on a flat surface produces lower signal than the signal hitting a point on a vertical or near vertical side. Thus, by analyzing the output signal, the edge detection algorithm may determine the location of an edge.

Conventional manufacturing model calibration methodologies usually use either critical dimension (CD) measurements or printed geometry contours for manufacturing process model calibration purposes. The problem with these conventional calibration methodologies is that neither the critical dimension measurements nor the printed geometry contours are produced directly by the measurement equipment such as a metrology tool. Rather, the critical dimensions and the printed geometry contours are typically extracted from the measurement data such as the SEM output data using various edge extraction algorithms which usually require extensive and thorough calibration before they may produce reasonable results. Often, two different edge extraction algorithms, even after extensive calibration, applied to the same geometrical pattern would produce different results. Therefore, the accuracy of such calibration methodologies is usually very sensitive to the choice of the edge extraction algorithm.

Another problem with such conventional calibration methodologies is that such edge extraction algorithms constitute inverse problems and thus are very sensitive to noises in the measurement data. These conventional model calibration methodologies' high sensitivity to noise in the measurement data is further aggravated as the ever increasingly shrinking feature sizes and the use of low-contrast manufacturing processes. As mentioned previously, one-dimensional scan data have been used for the critical dimension (CD) extraction, while two-dimensional images are used for the contour extraction. Both approaches inherently assume that the sidewalls can be well approximated by infinitely thin edges so that the notion of a feature edge can be clearly defined. Moreover, the extraction in both cases performed by some edge detection algorithms which contain one or more artificial parameters, a predefined threshold for example, which have to be calibrated using etalon measurements. In the modern low-contrast manufacturing processes, the measurement data are often noisy, and thus noise reduction and contrast enhancement methodologies are often required for the data collected from SEMs. More particularly, automatic contrast enhancement often fails to extract the edge data correctly, and thus such contrast enhancement methodologies often require manual enhancement.

As previously explained, edge detection algorithms analyze the collected SEM data to determine the locations of edges based upon the strength of the SEM output signals. Nonetheless, as the low-contrast manufacturing processes and ever increasingly shrinking feature sizes are more common in modern integrated circuit manufacturing, the side walls of features significantly differ from vertical and thus make the edge detection more difficult and more prone to noise due to the relatively lower ratio between SEM output signals from flat surfaces and those from edges.

Another approach is to use optical techniques such as optical scatterometry for tasks such as CD measurement rather than the electron microscope based metrology as described above. These optical techniques may be also be used for contour extraction, although typically with lower accuracy. For example, optical scatterometry instead of electron microscopy may be used for CD measurements. Scatterometry is a non-destructive optical technique that records and analyzes interference of light reflected from a scattering surface. By measuring and analyzing the light diffracted from a sample, the dimensions of the sample itself can be measured. Scatterometry exploits the sensitivity of diffraction from a sample to changes in the topography of the sample.

In optical scatterometry, information of the printed features of an integrated circuit may be obtained by illuminating the printed features of the integrated circuit with an optical beam and measuring the distribution of the light diffracted on these features. These optical methods such as the scatterometry described immediately above still suffer, however, similar problems as the metrology techniques employing electron microscopes or similar devices. For example, these metrology techniques require algorithms to solve complicated inverse problems. Moreover, the low-contrast images as a result of the modern low-contrast manufacturing processes pose the same problems with defining the contours, edges, or critical dimensions. Furthermore, as scatterometry exploits the sensitivity of diffraction from the sample, this method is also sensitive to noise in the information collected.

SUMMARY OF INVENTION

As such, there exists a need for a method and a system for simulating the manufacturing process with model calibration to avoid the error prone edge detection algorithms and the associated inverse problem. What is disclosed is a method, system, and computer program product for implementing a direct measurement model with accurate simulation or calibration of the manufacturing process model that do not require the use of edge detection or other indirect algorithms for extraction of the dimensions of the sample.

In various embodiments of the invention, the method or the system determines a direct measurement model and a process model which contains one or more empirical or non-empirical manufacturing process model parameters, iteratively simulates a measurement information based in part upon a result of simulating a manufacturing process on a test pattern using the manufacturing process model, determines whether the direct measurement information is satisfactory, calibrates the manufacturing process model where the direct measurement information is not satisfactory, and displays the direct measurement model or stores the direct measurement in a tangible computer readable medium. Moreover, in various embodiments of the invention, the empirical or non-empirical manufacturing process model parameters are characterized by being adjustable or being capable of being calibrated by the method or the system disclosed herein. In other embodiments of the invention, the manufacturing process model parameters are characterized by being capable of being measured.

BRIEF DESCRIPTION OF THE FIGURES

The accompanying drawings are included to provide a further understanding of the invention and, together with the Detailed Description, serve to explain the principles of the invention. Moreover, the drawings illustrate the design and utility of various embodiments of the invention. It shall be noted that the figures are not drawn to scale and that elements of similar structures or functions are represented by like reference numerals throughout the figures. In order to better appreciate how the above-recited and other advantages and objects of various embodiments of the present inventions are obtained, a more particular description of various embodiments of the present inventions briefly described above will be rendered by reference to specific embodiments thereof, which are illustrated in the accompanying drawings. Understanding that these drawings depict only exemplary embodiments of the invention and are not therefore to be considered limiting of its scope, various embodiments of the invention will be described and explained with additional specificity and details through the use of the accompanying drawings in which.

DETAILED DESCRIPTION

Figure 1A:
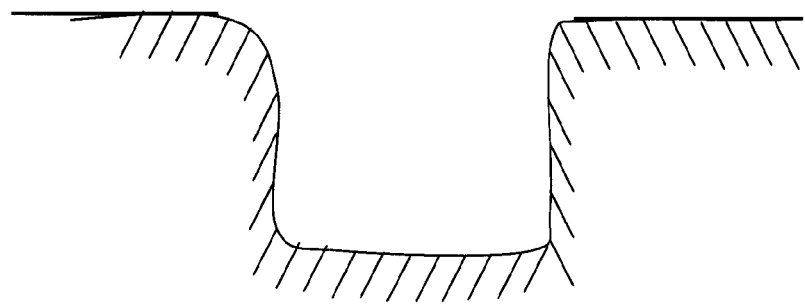
FIGS. 1A-1C illustrate the impact of low-contrast images produced by a manufacturing process on the determination of locations of edges or contours of a feature of an integrated circuit.
Figure 1B:
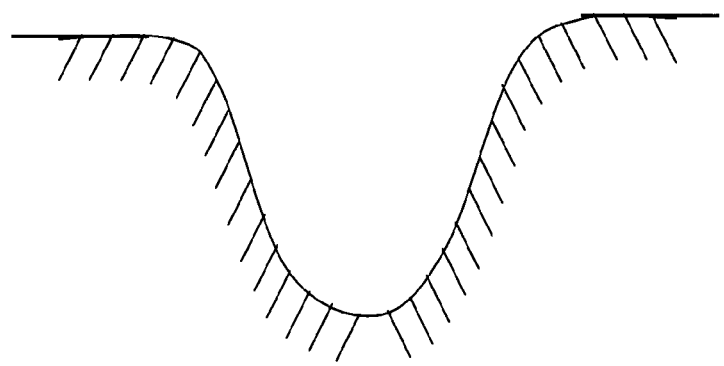
Figure 1C:
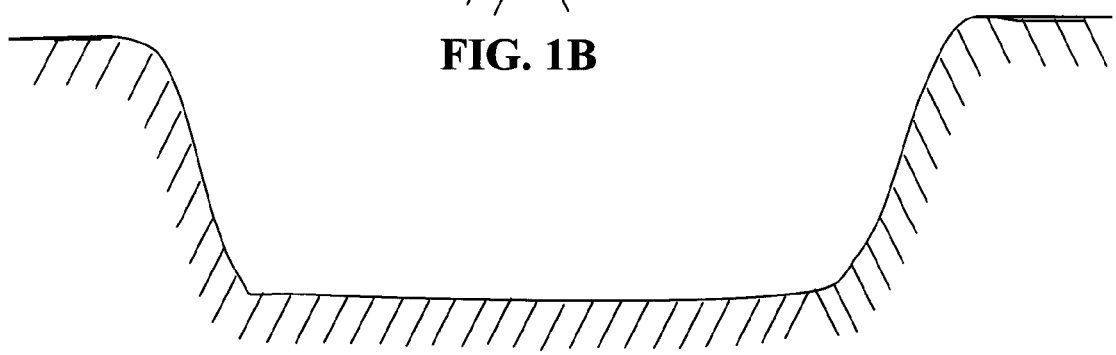

Various embodiments of the present invention are generally directed to a method, system, and computer program product for simulating manufacturing process and calibrating the manufacturing process model in an electronic circuit design. In various embodiments, the method or the system determines the measured data and the direct measurement model data and compares the direct measurement model data against the measured data to determine whether to adjust the manufacturing process models and the empirical parameters thereof.

In one embodiment of the present invention, the method or the system identifies an empirical process model and a direct measurement model. In another embodiment, each of the empirical process model and the direct measurement model contains its respective set of one or more empirical parameters. The method or the system in some embodiments of the invention further identifies a test pattern and then measures the results of the manufactured test pattern on a wafer. In one embodiment, the measured results of the manufactured test pattern on a wafer constituted a one-dimensional measurement of a feature dimension along a cut-line on the wafer. In another embodiment, the measured result of the test pattern on a wafer comprises raw signals of the output of the metrology tool. In some embodiments of the invention, the direct measurement model simulates the metrology process to obtain the direct measurement information. In some other embodiments of the invention, the direct measurement model emulates the metrology process to obtain the direct measurement information. In some other embodiments of the invention, the direct measurement model may comprises a data structure, a look-up table, or a database which comprises various direct measurement information with respect to various electronic circuit features and offers an efficient way to identify the direct measurement information without requiring extensive computation.

In some embodiments of the invention, part or all of the method or the system may be implemented as an embedded software or an embedded system. In some embodiments of the invention, an embedded software comprises a computer software or firmware that integrates with the electronic circuit with which the embedded software is supplied. An embedded system comprises an electronic circuit which is embedded with some form of embedded software and may further comprise hardware or mechanical components. In some embodiments of the invention, the embedded system is characterized by being programmable.

After determining the empirical process model and the direct measurement model, the method or system in some embodiments of the invention then iteratively simulates the test pattern using the empirical process model. The method or the system in some embodiments of the invention performs a simulation of the test pattern using the empirical process model. The method or the system in some embodiments of the invention then simulates a measurement result using the direct measurement model based upon a result of the simulation of the test pattern using the empirical process model.

After performing the simulation of the test pattern and the simulation of the measurement results with the empirical process model and the direct measurement model respectively, the method or system in some embodiments of the invention then determines whether the direct measurement information using the direct measurement model is satisfactory by comparing the simulated, emulated, or otherwise determined direct measurement data with the direct measurement data obtained from a measurement instrument.

In one embodiment, the method or the system compares the direct measurement information against the measured result of the manufactured test pattern with a metrology tool to determine whether the direct measurement result is sufficiently close to the measured result of the manufactured test pattern. In another embodiment of the invention, the method or the system compares the direct measurement information against the measured result of the manufactured test pattern based in part upon a predetermined tolerance or a convergence criterion within which the direct measurement result is determined to be sufficiently close to the measured result of the manufactured test pattern. In another embodiment, an error function is determined for the method or the system to perform such a comparison, and the method or the system performs an optimization process with respect to or based upon the error function.

The method or the system in some embodiments of the invention continues to the nest action where it is determined whether the direct measurement information is sufficiently close to the measured result of the manufactured test pattern, or whether the direct measurement result is satisfactory. In one embodiment, the method or the system determines that the direct measurement result is sufficiently close to the measured result of the manufactured test pattern or the direct measurement result is sufficiently satisfactory where the convergence criterion is met. In another embodiment, the method or the system determines that the direct measurement result is sufficiently close to the measured result of the manufactured test pattern or the direct measurement result is sufficiently satisfactory where the predetermined tolerance or the convergence criterion is met. In another embodiment, the method or the system determines that the direct measurement result is sufficiently close to the measured result of the manufactured test pattern or the direct measurement result is sufficiently satisfactory where the error function is optimized. The optimization of the error function may employ many different techniques which are well known in the art to one skilled in the art and thus will not be repeated herein.

On the other hand, where the method or the system in some embodiments of the invention determines that the direct measurement information is not sufficiently close to the measured result of the manufactured test pattern or is not sufficiently satisfactory, the method or the system in some embodiments of the invention adjusts the one or more empirical process model parameters and repeats the above actions from the iterative simulation of the test pattern. Similarly, where the method or the system in some embodiments of the invention determines that the direct measurement information is outside a predetermined tolerance or where the convergence criterion is not satisfied, the method or the system adjusts the one or more empirical process model parameters and repeats the above actions from the iterative simulation of the test pattern. Moreover, the iterative loop of the system or the method also adjusts the one or more empirical process model parameters where the error function is being optimized.

Figure 2:
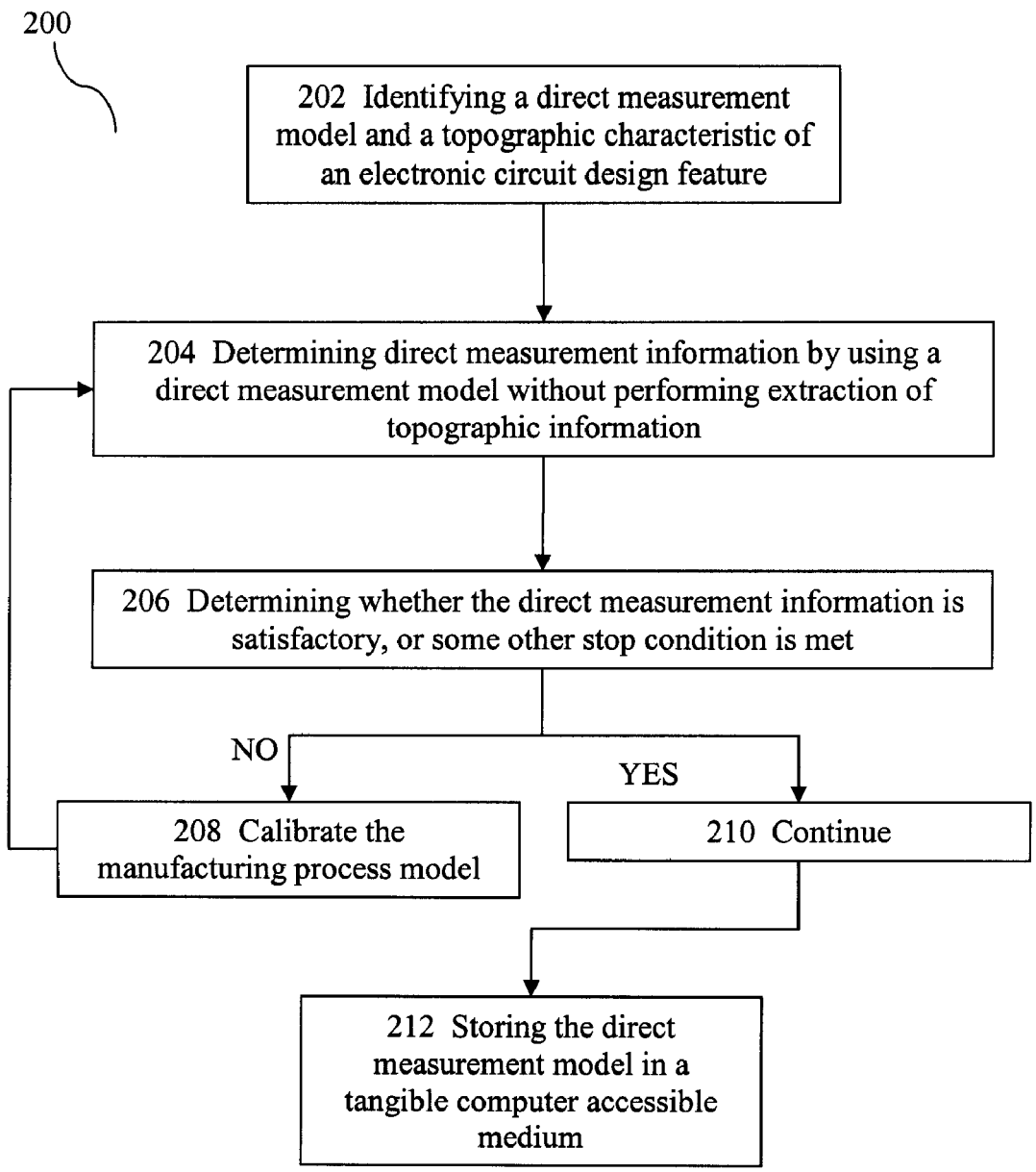
FIG. 2 illustrates a method and a system for simulating a manufacturing process while the process model is being calibrated in various embodiments of the invention.

Referring to FIG. 2 which illustrates a method or a system 200 for implementing a direct measurement model with manufacturing process model calibration while the manufacturing process model may be calibrated in some embodiments of the invention. In some embodiments of the invention, the method or the system implements a direct measurement model with manufacturing process model simulation or calibration for a physical design of an electronic circuit. At 202, the method or the system in some embodiments of the invention first identifies a direct measurement model. In some embodiments, the method or the system further identifies a manufacturing process model, in which the manufacturing process model contains one or more manufacturing process model parameters. In some embodiments of the invention, the manufacturing process model parameters comprise one or more empirical manufacturing process model parameters. Such one or more empirical manufacturing process model parameters comprise specific information of the processing equipment or processing recipes such as, but not limited to, the bias potential, plasma densities and distribution, vacuum level of the processing chamber, power supplied to sustain the plasma, wafer pedestal temperature distribution and control, other information such as the design layout, numerical aperture, diffusion length, development rate, or depth of focus of lithographic tools, chemistries used in the manufacturing processes, or information about the manufacturing-specific variations of fabrication processes. In various embodiments of the invention, the direct measurement model numerically represents the measurement process of some measurement instrumentation such as scanning electron microscopy (SEM), optical measurement techniques such as an optical scatterometry, or other metrology or nano-metrology instruments or tools. At 204, the method or the system in some embodiments of the invention determines a direct measurement information by using the direct measurement information. In some embodiments of the invention, the method or the system determines a direct measurement information based upon a result generated by a manufacturing process model for a plurality of electronic circuit features which are substantially similar to those of the electronic circuit design.

The direct measurement information is the direct output of a measuring device. For example, in a SEM, the direct measurement information comprises the information generated by the method or the system to represent the signal from the SEM's detector. As another example, in a scatterometer, the direct measurement information comprises the information generated by the method or the system to represent the signal such as the intensities of the diffraction orders, as measured by the detector(s). As another example, in a scanning tunneling microscope, the direct measurement information comprises the information generated by the method or the system to represent the signal such as the tunneling current as again measured by the device's detector. In various embodiments of the invention, the method or the system proposes not to apply any edge extraction processes but instead to determine (to model, to simulate, to emulate) the direct output of a measuring device. In various embodiments of the invention, a direct measurement model is a means for simulating, emulating, or otherwise determining the direct measurement information from topographic characteristics of one or more features in the electronic circuit and/or other properties, for example but not limited to, scattering coefficients of a sample under consideration, etc.

The method or the system in some embodiments of the invention then determines whether the direct measurement information is satisfactory at 206. In one embodiment, the method or the system in some embodiments of the invention compares the direct measurement information against the measured result of the manufactured test pattern with a metrology tool to determine whether the direct measurement information is sufficiently close to the measured result of the manufactured test pattern. In another embodiment of the invention, the method or the system compares the direct measurement information against the measured result of the manufactured test pattern with a metrology tool based upon a predetermined tolerance or a convergence criterion within which the direct measurement information is determined to be sufficiently close to the measured result of the manufactured test pattern. In another embodiment, the method or the system identifies or determines an error function, and the method or the system performs an optimization process for the error function.

At 208 where the method or the system in some embodiments of the invention determines that the direct measurement information is not satisfactory, the method or the system in some embodiments calibrates the manufacturing process model. In one embodiment, the method or the system calibrates the manufacturing process model by adjusting the one or more empirical manufacturing process model parameters where the method or the system determines that the direct measurement output information is not satisfactory. In another embodiment, the method or the system determines that the direct measurement information is not satisfactory if the direct measurement information is not sufficiently close to the measured result of the manufactured test pattern on a metrology tool. In another embodiment of the invention, the method or the system compares the direct measurement information against the measured result of the manufactured test pattern with a metrology tool based upon a predetermined tolerance or a convergence criterion outside of which the direct measurement result is determined to be not satisfactory the direct measurement information is determined to be not sufficiently close to the measured result of the manufactured test pattern. In some embodiments of the invention, the predetermined tolerance or a convergence criterion is determined based upon one or more factors which comprise at least one of a limit on the number of iterations allowed to be executed, the criticality of the electronic feature, the type or function of the electronic feature under examination, or the module or device to which the feature under examination belongs. Yet in another embodiment, the method or the system identifies or determines an error function for the direct measurement information, and the method or the system performs an optimization process for the error function.

Where the method or the system determines that, in some embodiments of the invention, the direct measurement information is not satisfactory at 206, the method or the system, in some embodiments, then calibrates the manufacturing process model at 208 and then goes back to action 204 to simulate a measurement information based upon another result of simulating a manufacturing process on a test pattern using the calibrated manufacturing process model. In some embodiments of the invention, the iterative loop terminates and moves on to action 210 where the method or the system determines, at 206, that the direct measurement information is satisfactory, or some other stop condition, such as exceeding a predetermined number of iterations, is met.

At 210 where it is determined that the direct measurement information is satisfactory or another stop condition is met, the method or the system continues to the next action. At 212, the method or the system in some embodiments displays the direct measurement information or stores the direct measurement information in a tangible computer accessible medium for use to aid the design of the integrated circuit.

Figure 3:
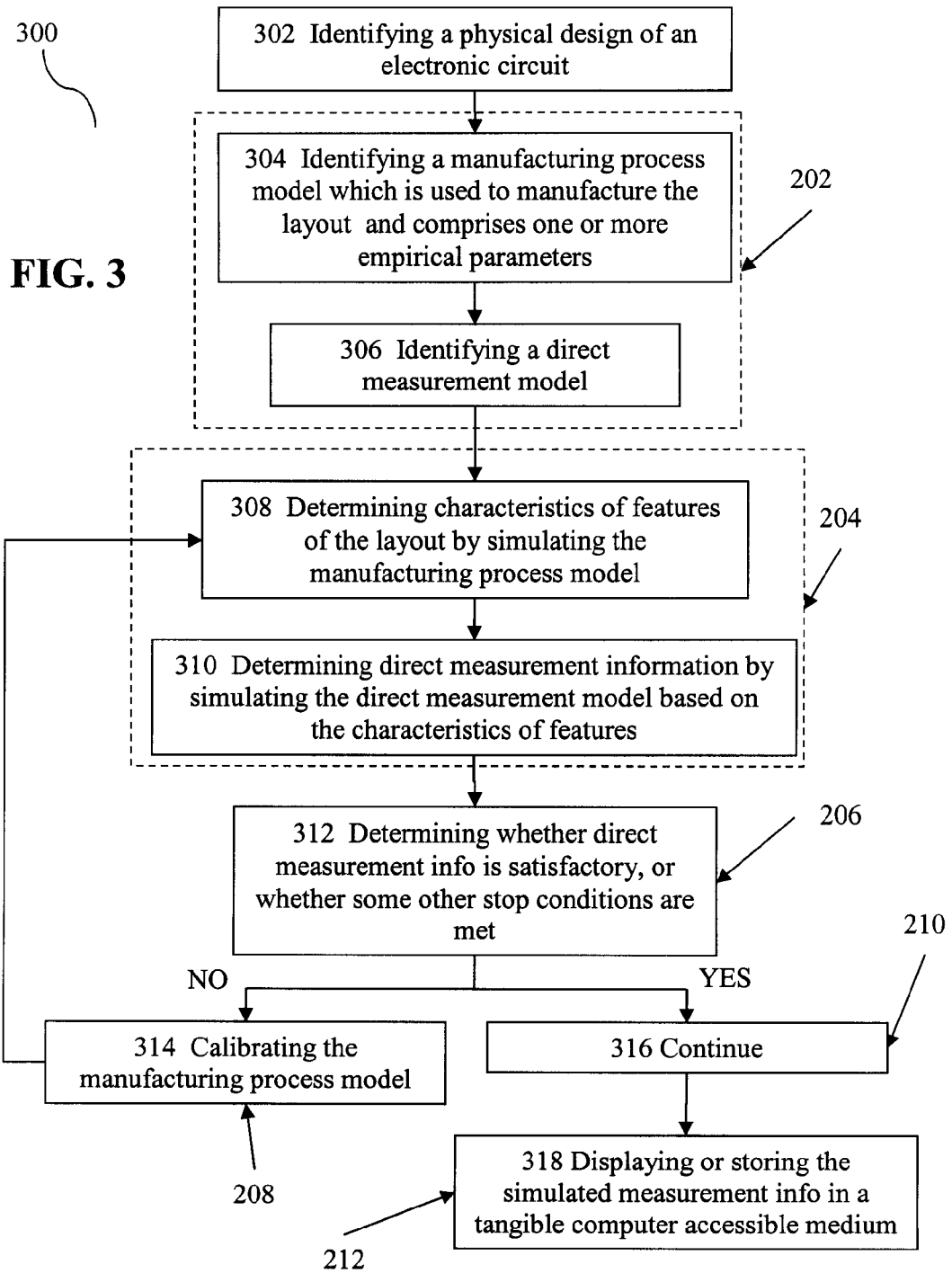
FIG. 3 illustrates further details of a method or a system for implementing a direct measurement model with manufacturing process model calibration in some embodiments of the invention.

Referring to FIG. 3 which illustrates further details of a method or a system 300 for implementing a direct measurement model with manufacturing process model calibration in some embodiments of the invention. At 302, the method or the system in some embodiments of the invention identifies a physical layout of an electronic circuit. At 304, the method or the system in some embodiments of the invention identifies a manufacturing process model of a manufacturing process which is used to manufacture the electronic circuit according to the physical layout. In some embodiments of the invention, the manufacturing process model comprises at least one empirical parameter. The at least one empirical manufacturing process model parameter comprises specific information of the processing equipment or processing recipes such as, but not limited to, the bias potential, plasma densities and distribution, vacuum level of the processing chamber, power supplied to sustain the plasma, wafer pedestal temperature distribution and control, other information such as the design layout, numerical aperture, diffusion length, development rate, or depth of focus of lithographic tools, chemistries used in the manufacturing processes, or information about the manufacturing-specific variations of fabrication processes.

At 306, the method or the system in some embodiments of the invention identifies a direct measurement model. In various embodiments of the invention, the direct measurement model numerically represents the measurement process of some measurement instrumentation such as scanning electron microscopy (SEM), optical measurement techniques such as an optical scatterometry, or other metrology or nanometrology instruments or tools. In some embodiments of the invention, the direct measurement model comprises one or more empirical parameters. In some other embodiments of the invention, the direct measurement model represents a formal model based on one or more theoretical or mathematical principles. In some embodiments of the invention, the action 202 in FIG. 2 comprises actions 304 and 306 in FIG. 3.

At 308, the method or the system in some embodiments of the invention determines one or more characteristics of features in the layout by simulating the manufacturing process model. In some embodiments of the invention, the one or more characteristics comprise an edge or a contour of a layout feature or geometric or topographic attribute(s) of one or more layout features such as dimensions, thicknesses, profiles, etc.

At 310, the method or the system in some embodiments of the invention determines the direct measurement information or data about the electronic design by simulating the direct measurement model based in part upon the one or more characteristics previously determined at 308. Note that since the method or the system directly simulate a direct measurement model representing the measurement process of a measurement instrument or tool, the method or the system need not solve or deal with an inverse problems as does a conventional method or system which involves the use of some edge extraction processes. In some embodiments of the invention, the action 204 in FIG. 2 comprises actions 308 and 310 in FIG. 3.

At 312, the method or the system in some embodiments of the invention determines whether the direct measurement information is satisfactory, or some other stop conditions, such as exceeding a predefined number of iterations, are met. In one embodiment, the method or the system in some embodiments of the invention compares the direct measurement information against the measured result of the manufactured test pattern with a metrology tool to determine whether the direct measurement information is sufficiently close to the measured result of the manufactured test pattern. In another embodiment of the invention, the method or the system compares the direct measurement information against the measured result of the manufactured test pattern with a metrology tool based upon a predetermined tolerance or a convergence criterion within which the direct measurement result is determined to be sufficiently close to the measured result of the manufactured test pattern. In another embodiment, the method or the system identifies or determines an error function, and the method or the system performs an optimization process for the error function.

At 314 where the method or the system in some embodiments of the invention determines that the direct measurement information is not satisfactory, the method or the system in some embodiments calibrates the manufacturing process model. In one embodiment, the method or the system calibrates the manufacturing process model by adjusting the one or more empirical manufacturing process model parameters where the method or the system determines that the direct measurement output information is not satisfactory. In another embodiment, the method or the system determines that the direct measurement information is not satisfactory if the direct measurement information is not sufficiently close to the measured result of the manufactured test pattern on a metrology tool.

In another embodiment of the invention, the method or the system compares the direct measurement information against the measured result of the manufactured test pattern with a metrology tool based upon a predetermined tolerance or a convergence criterion outside of which the direct measurement result is determined to be not satisfactory the direct measurement result is determined to be not sufficiently close to the measured result of the manufactured test pattern. In some embodiments of the invention, the predetermined tolerance or a convergence criterion is determined based upon one or more factors which comprise at least one of a limit on the number of iterations allowed to be executed, the criticality of the electronic feature, the type or function of the electronic feature under examination, or the module or device to which the feature under examination belongs. In another embodiment, the method or the system identifies or determines an error function for the direct measurement information, and the method or the system performs an optimization process for the error function.

Where the method or the system determines that, in some embodiments of the invention, the direct measurement information is not satisfactory at 312, the method or the system, in some embodiments, then calibrates the manufacturing process model at 314 and then loops back to action 308 to further determine the measurement information based upon another set of result(s) of simulating a manufacturing process on a test pattern using the calibrated manufacturing process model. In some embodiments of the invention, the iterative loop terminates and moves on to action 316 where the method or the system determines, at 312, that the direct measurement information is satisfactory, or that some other stop conditions is met.

After the method or the system has determined that the direct measurement information is satisfactory in some embodiments of the invention, the method or the system displays the direct measurement information to a user or a designer or stores the direct measurement information in a tangible computer readable medium.

Figure 4:
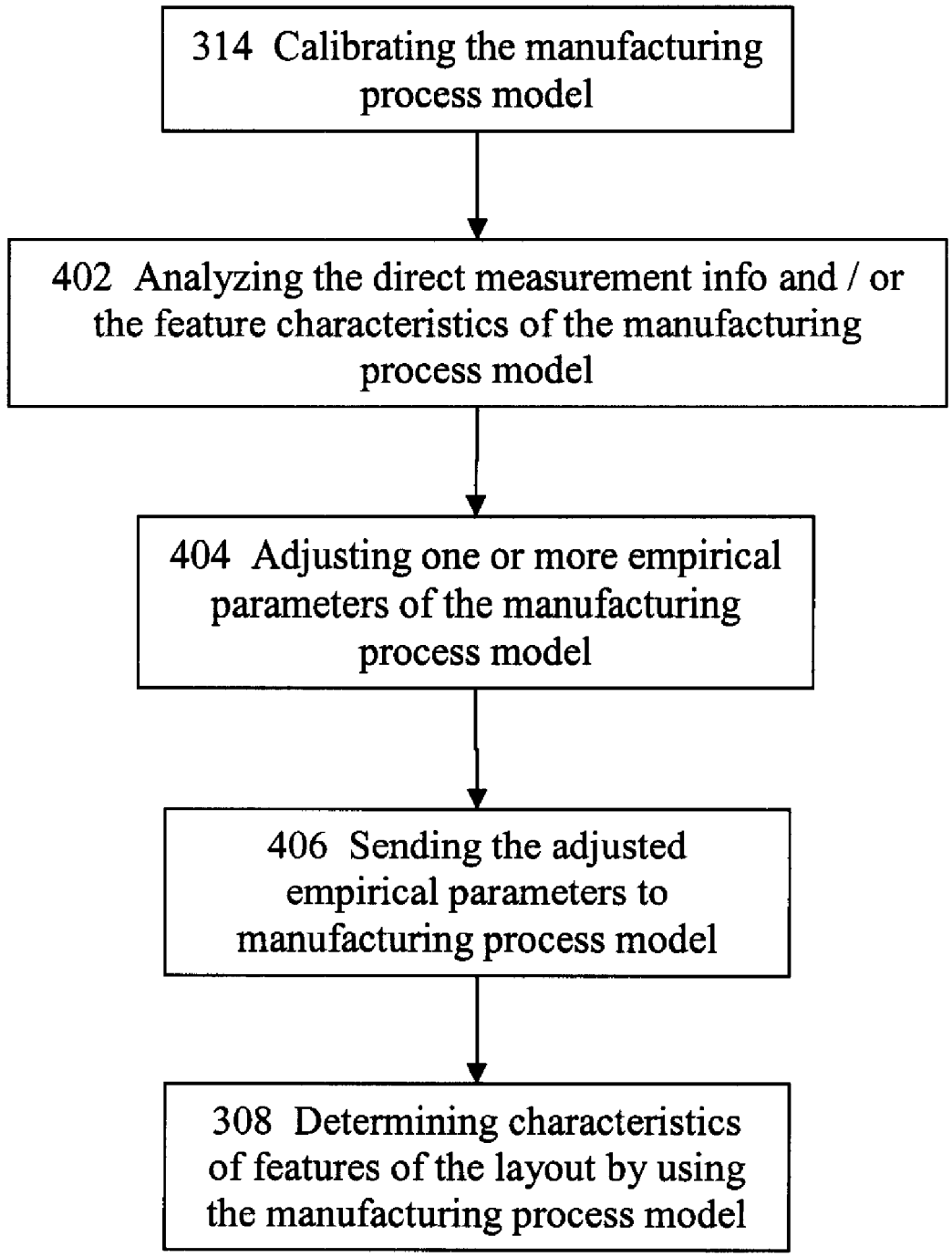
FIG. 4 illustrates further details of the action of calibrating the manufacturing process model in some embodiments of the invention.

Referring to FIG. 4 which illustrates further details of the action of calibrating the manufacturing process model of 314 or 208. At 402, the method or the system in some embodiments of the invention analyzes the direct measurement information, the simulated, emulated, or otherwise determined feature characteristics of the manufacturing process model, or both. At 404, the method or the system in some embodiments of the invention adjusts the one or more empirical parameters of the manufacturing process model based upon the result of the action at 402. In some embodiments of the invention, the method or the system then send the adjusted one or more empirical parameters or the entire set of the one or more empirical parameters back to the manufacturing process model at 406.

Figure 5:
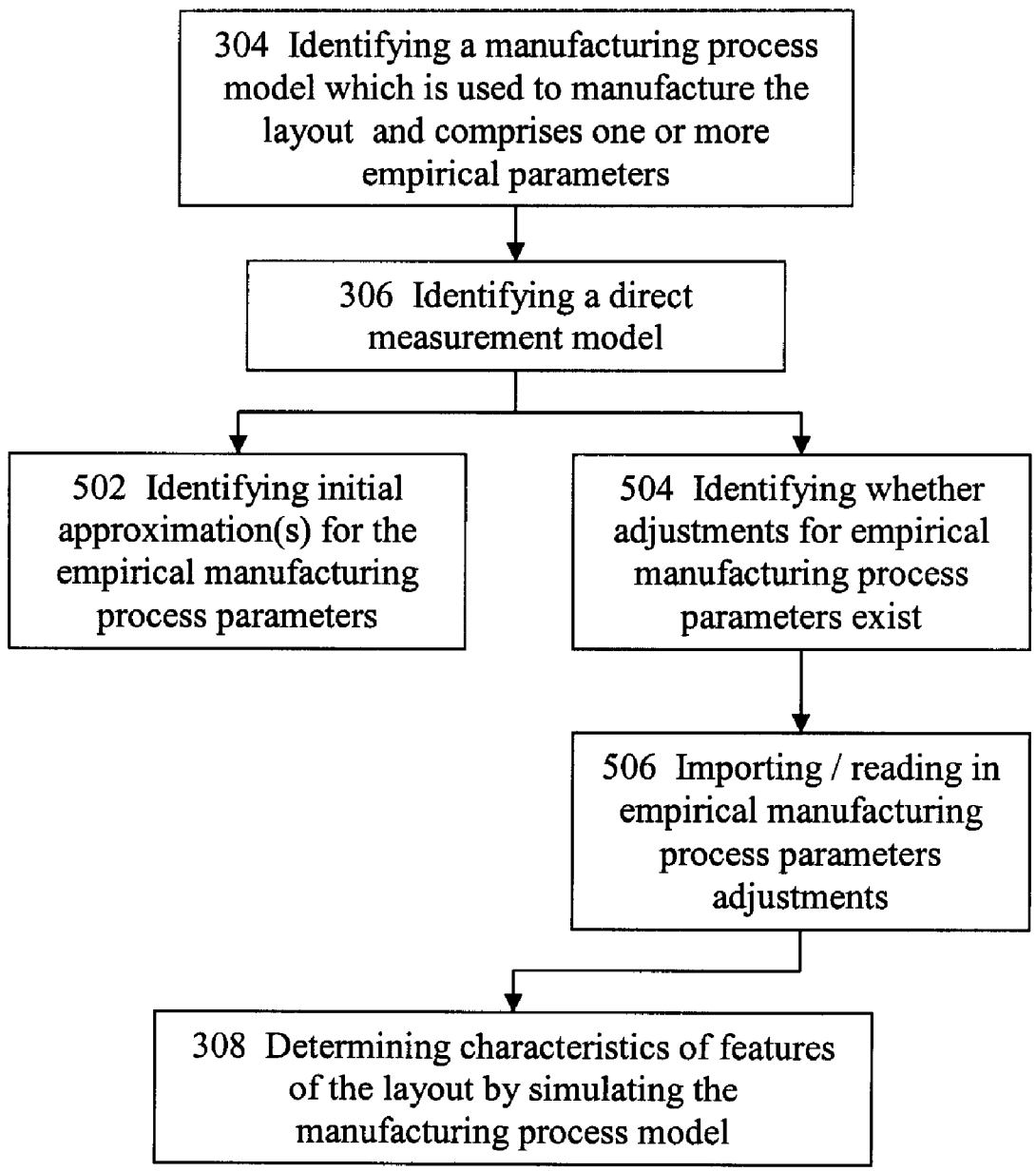
FIG. 5 illustrates further details of the action of identifying a direct measurement model in some embodiments of the invention.

Referring to FIG. 5 which illustrates further details of the action of identifying a direct measurement model of 306. After the action at 306 or 202, at 502, the method or the system in some embodiments of the invention identifies initial approximation(s) for the one or more empirical parameters of the manufacturing process model. In addition or in the alternative, at 504, the method or the system in some embodiments of the invention identifies whether an adjustment for any of the one or more empirical parameters for the manufacturing process model is available. In one embodiment of the invention, the method or the system may identifies the one or more empirical parameters or the entire set of the one or more empirical parameters which is previously adjusted in whole or in part and is sent by action 406. At 506, the method or the system in some embodiments of the invention then imports or reads in the adjusted one or more empirical parameters. Thereafter, in various embodiments of the invention, the method or the system continues to 308 or 204.

Figure 6:
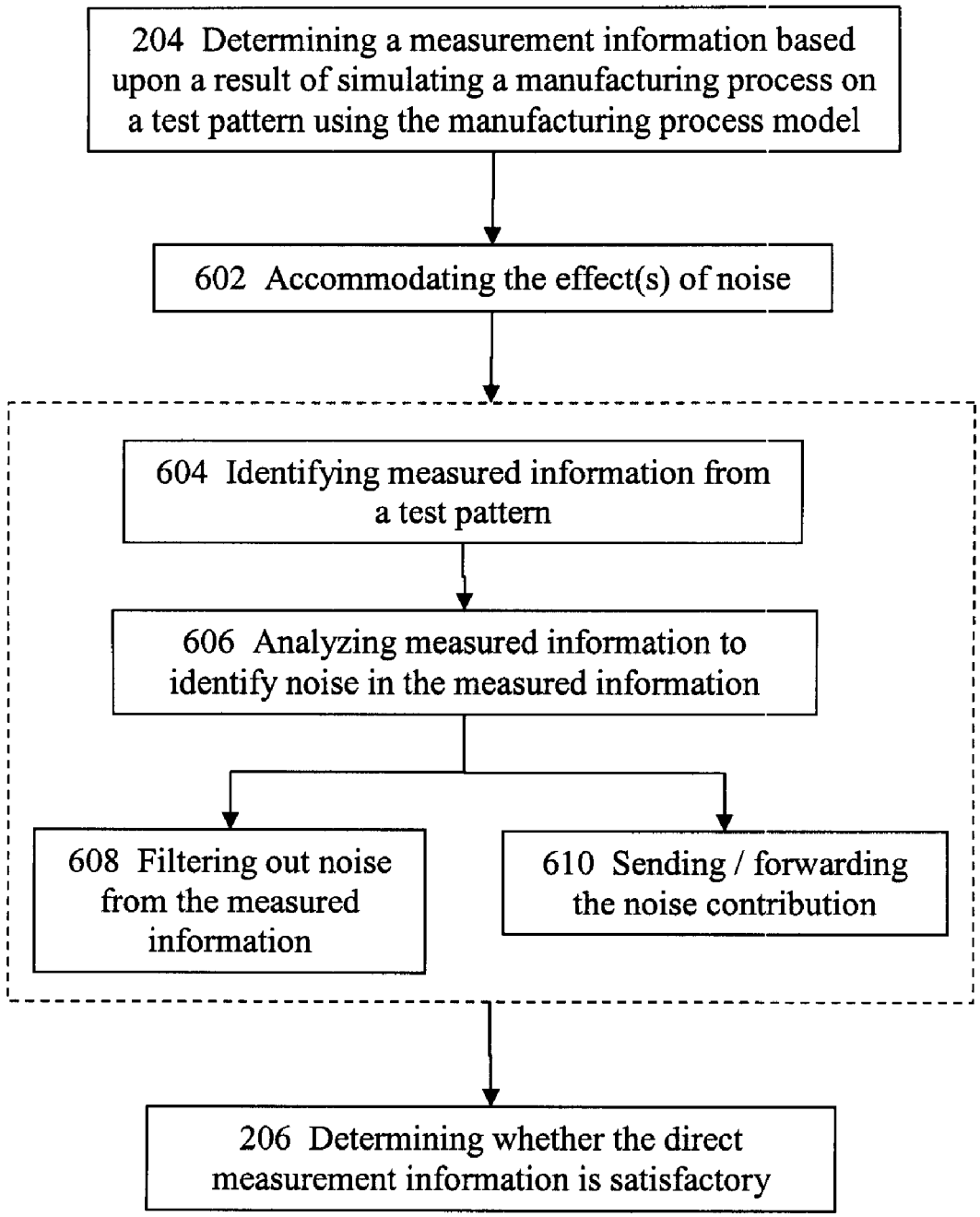
FIG. 6 illustrates further details of a method or a system for implementing a direct measurement model with manufacturing process model calibration for an electronic design in some embodiments of the invention.

Referring to FIG. 6 which illustrates further details of a method or a system for implementing a direct measurement model with manufacturing process model calibration for an electronic design. After 204 or 310, the method or the system in some embodiments of the invention accommodates the effect(s) of noise in the measured information which is obtained from, for example, a test pattern on a test wafer by a measurement instrument such as an SEM at 602. The action of accommodating the effect(s) of noise further comprises the following actions. At 604, the method or the system in some embodiments of the invention identifies a set of measured information from one or more test patters on a test wafer or from any patterned features of a semiconductor device.

At 606, the method or the system in some embodiments of the invention then analyzing the measured information so as to identify the contribution of noise in the measured information. Many processes, such as a fast Fourier transform (FFT), which are known to one of ordinary skill in the art, may be used to decompose the measured information in some embodiments of the invention and thus will not be repeated here. In some other embodiments of the invention, the method or the system may analyze the measured information without decomposing the measured information to determine the noise contribution in the measured information. At 608, the method or the system in some embodiments of the invention filters out all or a significant portion of the noise after analyzing or examining the decomposed measured information previously obtained at 606. In addition or in the alternative, at 610, the method or the system in some embodiments of the invention sends or forwards the noise contribution to the measured information to 206 so the method or the system may determine whether the direct measurement information is satisfactory while considering or accommodating the noise contribution in the measured information.

Figure 7:
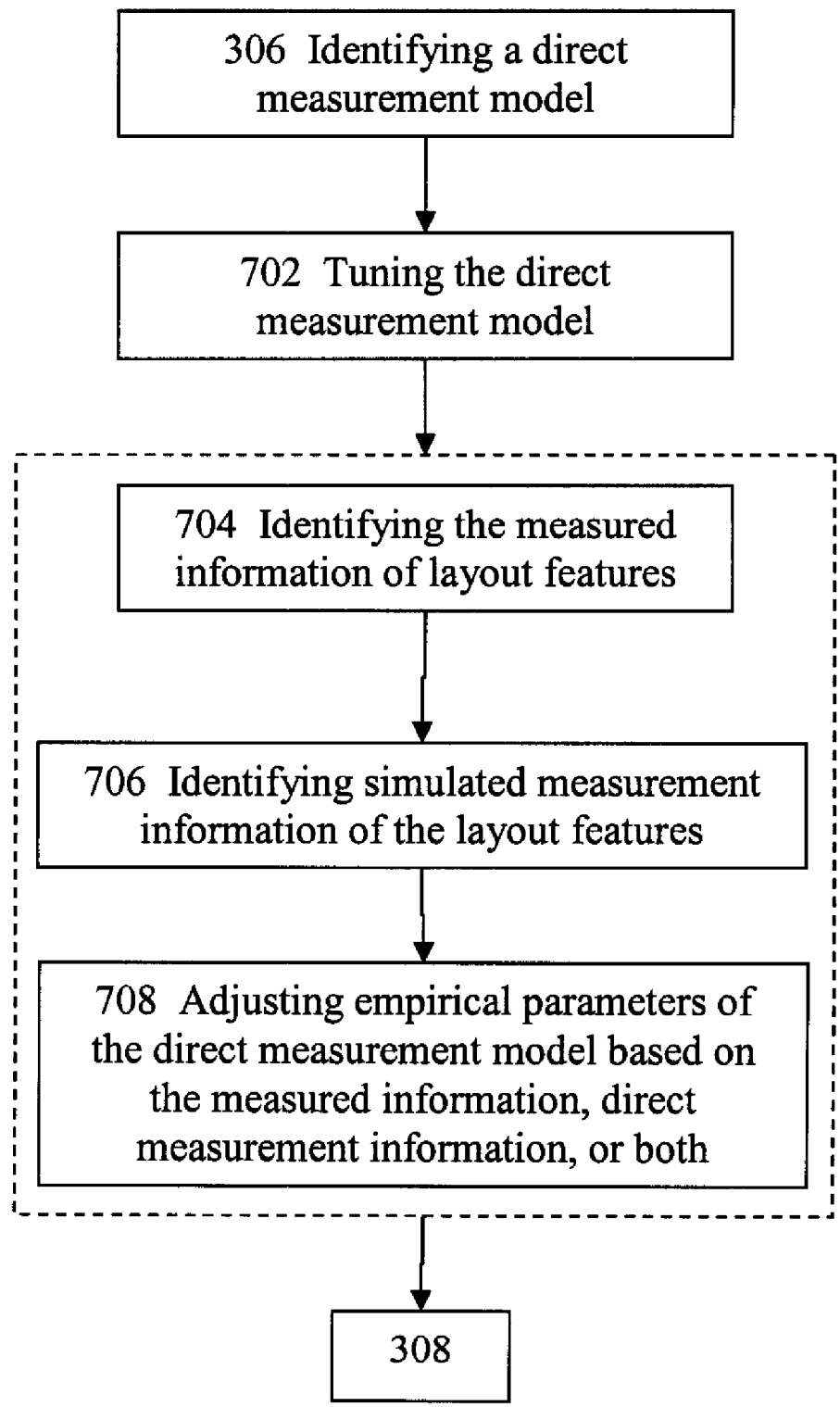
FIG. 7 illustrates a method or a system for fine tuning the direct measurement model in some embodiments of the invention.

Referring to FIG. 7 which illustrates a method or a system, 702, for fine tuning the direct measurement model in some embodiments of the invention. In some embodiments of the invention, the direct measurement model comprises one or more empirical parameters. In some embodiments of the invention, the method or system 702 is executed or performed only once. Moreover, in some embodiments of the invention, the method or the system 702 is not executed or performed separately as is the action of calibrating the manufacturing process model, 208 or 314, so as to avoid cross-talk between some empirical parameters or between the manufacturing process model and the direct measurement model which may cause one or both models to be incorrectly calibrated.

At 704, the method or the system in some embodiments of the invention identifies the measured information of a feature on a wafer. In one embodiment of the invention, the semiconductor feature comprises one or more test patterns on a test wafer. In another embodiment of the invention, the semiconductor feature comprises the layout under consideration. At 706, the method or the system in some embodiments of the invention identifies the direct measurement information for the same layout feature. In some embodiments of the invention, the direct measurement information for the same semiconductor feature may be obtained by simulating a manufacturing process model for the layout feature. At 708, the method or the system in some embodiments of the invention then adjusts or fine tunes all or some of the one or more empirical parameters based upon an analysis of the measured information, the direct measurement information, or both.

Figure 8C:
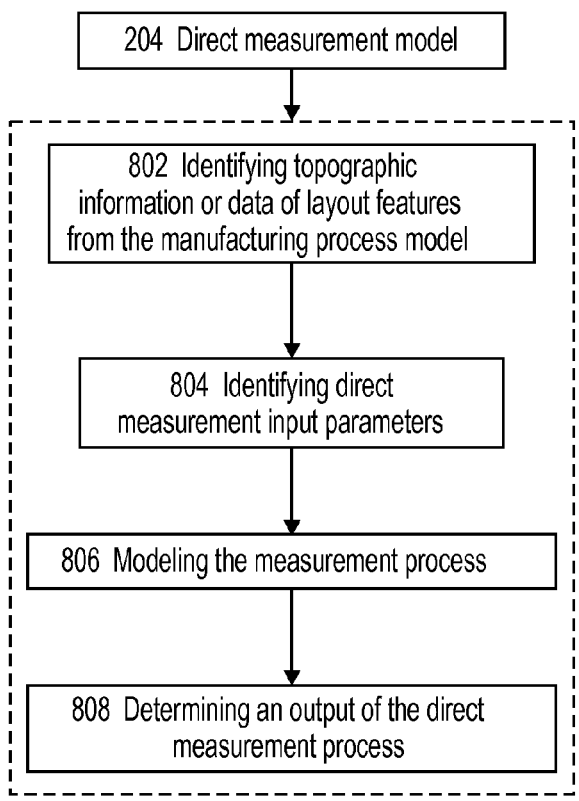
FIG. 8C illustrates further details of a method or a system for determining direct measurement information or data.
Figure 8A:
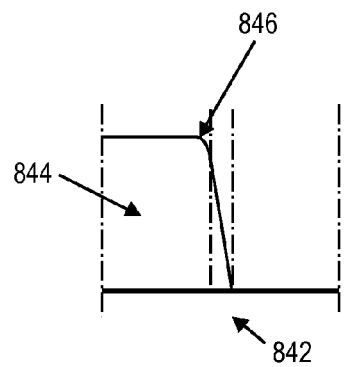
FIG. 8A illustrates a simplified exemplary layout feature as manufactured by a manufacturing process to demonstrate the direct measurement model in some embodiments of the invention.

Referring to FIG. 8A which illustrates a simplified exemplary layout feature as manufactured by a manufacturing process to demonstrate the direct measurement model in some embodiments of the invention. In FIG. 8A, 842 and 844 denote the substrate and the as manufactured layout feature respectively. Moreover, the substrate comprises, in some embodiments, a semiconductor substrate, semiconductor film, photoresist, or the combination thereof. In FIG. 8A, the as manufactured layout feature has a profile of a trapezoid with rounded corner 846.

Figure 8B:
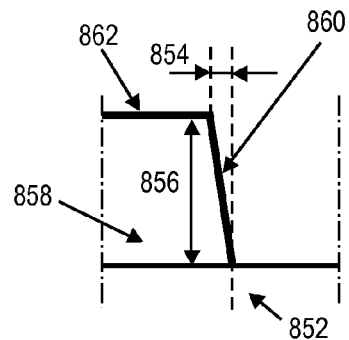
FIG. 8B illustrates, in one embodiment of the invention, a model of the layout feature in the direct measurement model which approximates the as manufactured layout feature as shown in FIG. 8A.

Referring to FIG. 8B which illustrates, in one embodiment of the invention, a model of the layout feature in the direct measurement model which approximates the as manufactured layout feature as shown in FIG. 8A. In FIG. 8B, the trapezoidal as manufactured layout feature is approximated by two straight line intersecting at an angle without the rounded corner in one embodiment of the invention for ease of explanation and does not intend to limit the scope of the application to such a layout feature. More complex layout features may also be approximated in various other ways which are well within the knowledge of one of ordinary skill in the art and thus will not be repeated herein. Moreover, an SEM measurement process is used herein for illustration purpose only and does not intend to limit the scope of the application. Other measurement processes can also be modeled in similar manners which are well within the knowledge of one of ordinary skill in the art and will not be repeated herein.

In FIG. 8B, 852 denotes one or more substrate scattering parameters, and 858 represents one or more layout feature scattering parameters. In some embodiments of the invention, the scattering parameters comprise, for example, the scattering coefficients for the materials of the layout feature or the substrate. Also in FIG. 8B, 856, and 864 represent the height, and slope (or delta) of the layout feature, in which the slope is defined to be the offset between the two parallel sides of the trapezoid, and the delta is defined to be the offset between the lengths of the two parallel sides. In addition, 860 and 862 represent the horizontal top surface and the slant surface. For the SEM metrology process, the scattered beam intensity as a result of the electron beam hitting the slant surface is greater than that as a result of the electron beam hitting the horizontal surface. Moreover, depending upon the measurement process modeled, various topographic or intrinsic parameters may be determined or identified differently. For example, where the method or the system in some embodiments of the invention models the SEM metrology process, the height, slope, or delta may be numerically extracted from the SEM signal. The method or the system then simulates the direct measurement to determine the indirect information about the transition region without performing a conventional edge extract algorithm or technique. In the alternative, these topographic parameters may also be, in some other embodiments, obtained from the simulation result of the manufacturing process model and then used as input parameters to the direct measurement model.

FIG. 8C illustrates further details of a method or a system for determining direct measurement information or data of the action 204. At 802, the method or the system in some embodiments of the invention identifies topographic information or data of one or more layout features to be modeled in the direct measurement model.

At 804, the method or the system in some embodiments of the invention identifies input parameters for the direct measurement model. The input parameters comprise one or more geometric input parameters and one or more intrinsic direct measurement model parameters. The geometric input parameters comprises geometric information or data such as height, width, spacing, thickness, delta, radius, or other topographic information or data of one or more layout features. In some embodiments of the invention, the geometric input parameters are obtained from the manufacturing process model. The intrinsic direct measurement model parameters comprise parameters such as scattering coefficients or optical parameters of resist and substrate which may be defined, in some embodiments of the invention, within the direct measurement model. In some embodiments of the invention, the intrinsic parameters may be adjusted by comparing the results of the approximate model with the result of a more accurate model, or experimental results, for a structure with a well known geometry.

At 806, the method or the system of some embodiments of the invention models the measurement or metrology process while using the geometric and intrinsic input parameters as input. In one embodiment, the measurement or metrology process may be measured by using RCWA (rigorous coupled wave analysis). At 808, the method or the system in some embodiments of the invention determines an output of the direct measurement or metrology process. In one embodiment of the invention, the output comprises the scattered electron beam intensity. In addition, in some embodiments of the invention, the method or the system may use a look-up table which contains various scattered electron beam intensity values in determining the output to accelerate the determination. In some embodiments of the invention, various stochastic numerical technique, such as the Monte-Carlo or Quasi Monte-Carlo technique, may be used to determine the output.

The detailed description is provided in connection with such examples, but is not limited to any such particular examples. Numerous specific details are set forth in the following description in order to provide a thorough understanding of various embodiments of the subject matters of the invention. These specific details are provided for illustrative purposes and the described techniques may be practiced according to the claims without some or all of these specific details. For the purpose of clarity, technical material that is known in the technical fields related to the examples has not been described in detail to avoid unnecessarily obscuring the description.

System Architecture Overview

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Figure 9:
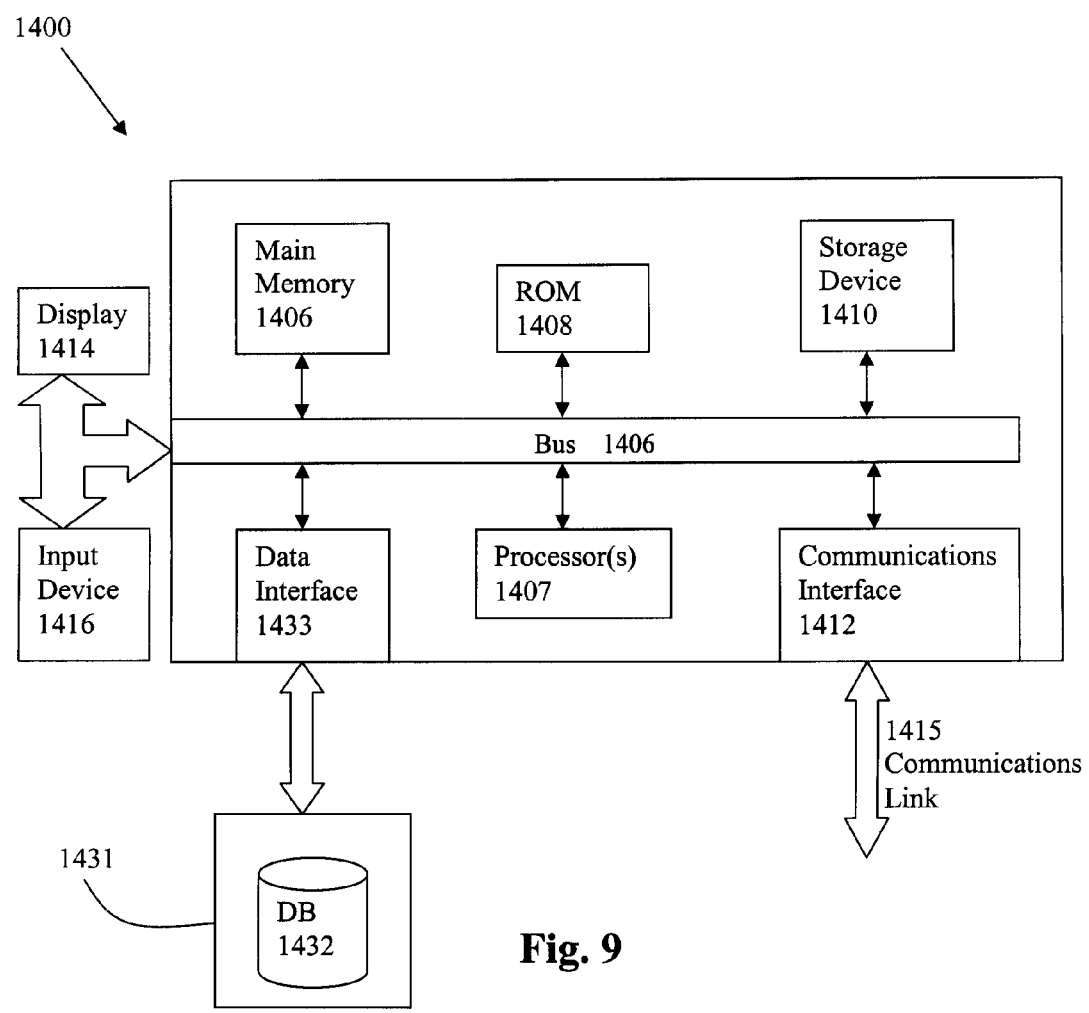
FIG. 9 depicts a computerized system on which a method for implementing direct measurement model can be implemented.

FIG. 9 is a block diagram of an illustrative computing system 1400 suitable for implementing an embodiment of the present invention. Computer system 1400 includes a bus 1402 or other communication mechanism for communicating information, which interconnects subsystems and devices, such as processor 1404, system memory 1406 (e.g., RAM), static storage device 1408 (e.g., ROM), disk drive 1410 (e.g., magnetic or optical), communication interface 1412 (e.g., modem or ethernet card), display 1414 (e.g., CRT or LCD), input device 1416 (e.g., keyboard), and cursor control 1418 (e.g., mouse or trackball. Not shown.)

According to one embodiment of the invention, computer system 1400 performs specific operations by processor 1407 executing one or more sequences of one or more instructions contained in system memory 1406. Such instructions may be read into system memory 1406 from another computer readable/usable medium, such as static storage device 1408 or disk drive 1410. In alternative embodiments, hard-wired circuitry may be used in place of or in combination with software instructions to implement the invention.

The term "computer readable medium" or "computer usable medium" as used herein refers to any medium that participates in providing instructions to processor 1407 for execution. Such a medium may take many forms, including but not limited to, non-volatile media, and volatile media. Non-volatile media includes, for example, optical or magnetic disks, such as disk drive 1410. Volatile media includes dynamic memory, such as system memory 1406.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1412. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention.

Although the operation of the invention is described in terms of the electronic circuit manufacturing modeling, the scope of the invention is not bounded by that manufacturing field. For example, the same principles as described by the present invention can be used and would benefit other precise device manufacturing modeling fields, such as modeling the manufacturing process of micro-electro-mechanical systems (MEMS), or printed optical systems such as arrayed waveguides (AWG), or other. The specification and drawings are, accordingly, to be regarded in an illustrative rather than restrictive sense.

What is claimed is:

1. A computer implemented method for implementing a direct measurement model for an electronic circuit design, comprising:
    using a computing system that comprises at least one processor and is configured for performing a process comprising:
    identifying a direct measurement model, wherein the direct measurement model simulates or emulates a metrology process without performing extraction on the electronic circuit design;
    identifying a topographic characteristic of a feature in the electronic circuit design or in a test pattern, wherein the topographic characteristic is identified by using at least a manufacturing process model which comprises a process model parameter; and
    determining a direct measurement information by using the direct measurement model based at least in part upon the topographic characteristic, in which
        the direct measurement information comprises a simulated or emulated measurement output of a metrology device for the metrology process.

2. The computer implemented method of claim 1, in which a portion of the computer implemented method comprises an embedded software.

3. The computer implemented method of claim 1, the computing system is further configured for performing:
    calibrating the manufacturing process model where the direct measurement information is determined not to be satisfactory, in which the action of calibrating the manufacturing process model comprises:
    adjusting at least one of the one or more manufacturing process model parameters.

4. The computer implemented method of claim 3, further comprising:
    analyzing the direct measurement information or the topographic characteristic of a feature in the electronic circuit physical design; and
    adjusting the at least one of the one or more manufacturing process model parameters based at least in part upon a result of the action of analyzing the direct measurement information or the topographic characteristic of a feature in the electronic circuit physical design.

5. The computer implemented method of claim 4, further comprising:
updating the manufacturing process model with the at least one of the one or more manufacturing process model parameters.

6. The computer implemented method of claim 3, in which the action of determining a direct measurement model comprises:
identifying the at least one of the one or more manufacturing process model parameters adjusted.

7. The computer implemented method of claim 1, in which the action of determining a direct measurement model comprises:
identifying an initial approximation for the one or more manufacturing process parameters.

8. The computer implemented method of claim 1, further comprising:
accommodating an effect of noise in the action of determining the direct measurement information or in the action of determining whether the direct measurement information is satisfactory.

9. The computer implemented method of claim 8, further comprising:
determining noise in the measured information by analyzing the measured information.

10. The computer implemented method of claim 9, further comprising:
filtering out all or part of the noise from the measured information.

11. The computer implemented method of claim 1, further comprising:
identifying a measured information of a feature on a wafer.

12. The computer implemented method of claim 11, further comprising:
determining whether the direct measurement information is satisfactory while accounting for the noise in the measured information.

13. The computer implemented method of claim 11, in which the direct measurement information is determined to be satisfactory where the direct measurement information is within a tolerance from the measured information.

14. The computer implemented method of claim 1, in which the direct measurement information is determined to be satisfactory when a stop condition is satisfied.

15. The computer implemented method of claim 14, in which the stop condition is a predetermined limit on a number of iterations allowed to run.

16. The computer implemented method of claim 1, further comprising:
tuning the direct measurement model.

17. The computer implemented method of claim 16, in which the tuning the direct measurement model comprises:
identifying a measured information of a feature in the electronic circuit physical design;
identifying the direct measurement information for the feature in the electronic circuit physical design;
analyzing the direct measurement information and the measured information; and
adjusting one or more direct measurement model parameters based at least in part upon a result of the action of analyzing.

18. The computer implemented method of claim 1, in which the action of determining the direct measurement information comprises:
identifying the topographic characteristic of the feature in the electronic circuit physical design;
identifying a plurality of direct measurement input parameters;
simulating a direct measurement process defined by the direct measurement model based at least in part upon the topographic characteristic and the plurality of direct measurement input parameters; and
determining the output of the metrology device used in the metrology process.

19. The computer implemented method of claim 18, in which the plurality of direct measurement input parameters comprise a topographic input parameter or an intrinsic model parameter.

20. The computer implemented method of claim 19, in which the topographic input parameter comprises height, width, thickness, delta, or radius of a feature in the electronic circuit physical design or spacing between two features in the electronic circuit physical design.

21. The computer implemented method of claim 19, in which the intrinsic input parameter comprises resist reflectance or substrate reflectance.

22. The computer implemented method of claim 1, in which the action of determining the direct measurement information is performed without performing extraction from the electronic circuit design or edge detection.

23. The computer implemented method of claim 1, in which the action of determining the direct measurement information is performed by using at least the topographic characteristic from the manufacturing process model and information or data of a signal generated by the direct measurement model.

24. A system for implementing a direct measurement model in an electronic circuit design, comprising:
a computing system that comprises at least one processor and is configured for performing a process, comprising:
identifying a direct measurement model, wherein the direct measurement model simulates or emulates a metrology process without performing extraction on the electronic circuit design;
identifying a topographic characteristic of a feature in the electronic circuit design or in a test pattern, wherein the topographic characteristic is identified by using at least a manufacturing process model which comprises a process model parameter; and
determining a direct measurement information by using the direct measurement model based at least in part upon the topographic characteristic, in which
the direct measurement information comprises a simulated or emulated measurement output of a metrology device for the metrology process.

25. The system of claim 24, the computing system is further configured for performing the process, the process further comprising:
calibrating the manufacturing process model where the direct measurement information is determined not to be satisfactory, in which the action of calibrating the manufacturing process model comprises:
adjusting at least one of the one or more manufacturing process model parameters.

26. The system of claim 25, the computing system is further configured for performing the process, the process further comprising:
analyzing the direct measurement information or the topographic characteristic of a feature in the electronic circuit physical design; and
adjusting the at least one of the one or more manufacturing process model parameters based at least in part upon a result of the action of analyzing the direct measurement information or the topographic characteristic of a feature in the electronic circuit physical design.

27. The system of claim 24, the computing system is further configured for performing the process, the process further comprising:
tuning the direct measurement model;
identifying a measured information of a feature in the electronic circuit physical design;
identifying the direct measurement information for the feature in the electronic circuit physical design;
analyzing the direct measurement information and the measured information; and
adjusting one or more direct measurement model parameters based at least in part upon a result of the action of analyzing.

28. The system of claim 24, the computing system configured for performing the action of determining the direct measurement information is further configured for performing the process, the process further comprising:
identifying the topographic characteristic of the feature in the electronic circuit physical design;
identifying a plurality of direct measurement input parameters;
simulating a direct measurement process defined by the direct measurement model based at least in part upon the topographic characteristic and the plurality of direct measurement input parameters; and
determining an output of the direct measurement process.

29. A computer program product that includes a non-transitory computer accessible storage medium usable by at least one processor, the non-transitory computer accessible storage medium having stored thereon a sequence of instructions which, when executed by the at least one processor, causes the at least one processor to execute a method for implementing a direct measurement model for an electronic circuit design, the method comprising:
using a computing system that comprises the at least one processor and is configured for performing a process, the process comprising:
identifying a direct measurement model, wherein the direct measurement model simulates or emulates a metrology process without performing extraction on the electronic circuit design;
identifying a topographic characteristic of a feature in the electronic circuit design or in a test pattern, wherein the topographic characteristic is identified by using at least a manufacturing process model which comprises a process model parameter;
determining a direct measurement information by using the direct measurement model based at least in part upon the topographic characteristic, in which
the direct measurement information comprises a simulated or emulated measurement output of a metrology device for the metrology process.

30. The computer program product of claim 29, the process further comprising:
calibrating the manufacturing process model where the direct measurement information is determined not to be satisfactory, in which the action of calibrating the manufacturing process model comprises:
adjusting at least one of the one or more manufacturing process model parameters.

31. The computer program product of claim 30, the process further comprising:
analyzing the direct measurement information or the topographic characteristic of a feature in the electronic circuit physical design; and
adjusting the at least one of the one or more manufacturing process model parameters based at least in part upon a result of the action of analyzing the direct measurement information or the topographic characteristic of a feature in the electronic circuit physical design.

32. The computer program product of claim 29, the process further comprising:
tuning the direct measurement model;
identifying a measured information of a feature in the electronic circuit physical design;
identifying the direct measurement information for the feature in the electronic circuit physical design;
analyzing the direct measurement information and the measured information; and
adjusting one or more direct measurement model parameters based at least in part upon a result of the action of analyzing.

33. The computer program product of claim 29, the process for determining the direct measurement information further comprising:
identifying the topographic characteristic of the feature in the electronic circuit physical design;
identifying a plurality of direct measurement input parameters;
simulating a direct measurement process defined by the direct measurement model based at least in part upon the topographic characteristic and the plurality of direct measurement input parameters; and
determining an output of the direct measurement process.

* * * * *